United States Patent
Wang et al.

(10) Patent No.: US 8,802,541 B2
(45) Date of Patent: Aug. 12, 2014

(54) METHOD FOR LOW TEMPERATURE WAFER BONDING AND BONDED STRUCTURE

(71) Applicant: Lexvu Opto Microelectronics Technology (Shanghai) Ltd., Shanghai (CN)

(72) Inventors: Zhiwei Wang, Shanghai (CN); Jianhong Mao, Shanghai (CN); Lei Zhang, Shanghai (CN); Deming Tang, Shanghai (CN)

(73) Assignee: Lexvu Opto Microelectronics Technology (Shanghai) Ltd., Shanghai (CN)

( * ) Notice: Subject to any disclaimer, the term of this patent is extended or adjusted under 35 U.S.C. 154(b) by 0 days.

(21) Appl. No.: 13/896,593

(22) Filed: May 17, 2013

(65) Prior Publication Data
US 2013/0307165 A1    Nov. 21, 2013

(30) Foreign Application Priority Data

May 18, 2012  (CN) .......................... 2012 1 0161459

(51) Int. Cl.
*H01L 21/76*  (2006.01)

(52) U.S. Cl.
USPC ..... 438/459; 438/452; 257/618; 257/E21.211

(58) Field of Classification Search
USPC ........... 257/455, 458, E21.211; 438/455, 458
See application file for complete search history.

(56) References Cited

U.S. PATENT DOCUMENTS

| | | | | |
|---|---|---|---|---|
| 6,962,835 B2 * | 11/2005 | Tong et al. | .................... | 438/108 |
| 7,203,387 B2 * | 4/2007 | Doan | .............................. | 385/14 |
| 8,507,358 B2 * | 8/2013 | Chou | ............................ | 438/452 |

* cited by examiner

*Primary Examiner* — Roy Potter
(74) *Attorney, Agent, or Firm* — Harness, Dickey & Pierce, P.L.C.

(57) ABSTRACT

A low temperature wafer bonding method and a bonded structure are provided. The method includes: providing a first substrate having a plurality of metal pads and a first dielectric layer close to the metal pads, where the metal pads and the first dielectric layer are on a top surface of the first substrate; providing a second substrate having a plurality of semiconductor pads and a second dielectric layer close to the semiconductor pads, where the semiconductor pads and the second dielectric layer are on a top surface of the second substrate; disposing at least one of the metal pads in direct contact with at least one of the semiconductor pads, and disposing the first dielectric layer in direct contact with the second dielectric layer; and bonding the metal pads with the semiconductor pads, and bonding the first dielectric layer with the second dielectric layer.

14 Claims, 7 Drawing Sheets

METHOD FOR LOW TEMPERATURE WAFER BONDING AND BONDED STRUCTURE

CROSS REFERENCE TO RELATED APPLICATIONS

The present application claims priority to Chinese patent application No. 201210161459.0, filed on May 18, 2012, and entitled "METHOD FOR LOW TEMPERATURE WAFER BONDING AND BONDED STRUCTURE", the entire disclosure of which is incorporated herein by reference.

FIELD OF THE DISCLOSURE

The present invention generally relates to the wafer bonding technology, and more particularly, to a low temperature wafer bonding method by using integrated circuit manufacturing process and a bonded structure formed with the method.

BACKGROUND

As physical performances of traditional CMOS devices gradually approach the quantum limit, there is an urgent demand for high-performance electronic systems. System-on-chip (SOC) is becoming a solution of the semiconductor industry. As for a SOC, various functions are integrated on one chip. Although forming a circuit on a silicon substrate is currently a mainstream for forming an ultra-large-scale device, it is better to form a device and/or circuit on a non-silicon substrate to obtain the required circuit or photoelectric functions. Therefore, a mixed system including a silicon-based device and a non-silicon-based device, rather than an individual one of them, may be a practical way to obtain a certain SOC function.

Forming a heterogeneous material on a silicon substrate with heteroepitaxial growth is one of the ways to form a heterogeneous device. Nowadays, a heteroepitaxial film formed by heteroepitaxial growth has a drawback of high density, which is mainly due to the lattice constant mismatch between a non-silicon-based film and a silicon substrate.

Another method for forming a heterogeneous device is wafer bonding. However, during the wafer bonding processes, because different materials have different thermal expansion coefficients, the thermal stresses generated in the heating process may cause dislocation, peeling or cracking. Therefore, the wafer bonding needs to be performed at a low temperature, especially for those materials having a lower decomposition temperature or temperature-sensitive devices, such as InP heterojunction bipolar transistor or silicon devices with ultra-shallow source and drain. Than is, the low temperature wafer bonding process is very important for different materials.

It is difficult to manufacture a chip having different functions and different materials and the processes are difficult to be optimized, resulting in a low yield for many SOCs, especially for those in large-scale integration. One solution is to make the process compatible with IC process by wafer bonding. However, wafer bonding is generally performed at a high temperature, which may lead to thermal stresses, bubbles and instable adhesions, resulting in a low yield and poor reliability.

Direct wafer bonding is a kind of technology for bonding wafers at a low temperature without any adhesive. The direct wafer bonding is performed in vacuum environment. The bonding process is performed at a low temperature, generally at room temperature, so no thermal stresses and heterogeneity will be introduced and it enables to produce more reliable circuits. Further, if a bonded wafer is processed by a thinning process and is thinned to have a thickness less than the respective critical values of combined materials, layer dislocation, slip or cracking may be avoided in subsequent heat treatments.

Furthermore, direct wafer bonding and layer transfer is compatible with the very large scale integration (VLSI) circuit, namely, it is feasible and manufacturable, and it is very practical to use this technique to form a stacked three-dimensional SOC. The three-dimensional SOC is to form a system by integrating existing integrated circuits on a chip.

At low temperatures, it is practical to form a three-dimensional SOC by direct bonding between wafers or chips, which may electrically connect the wafers or chips. Besides, non-metal regions of the wafers or chips may be directly bonded, therefore, post-treatment processes after bonding, such as substrate thinning, etching, metal interconnecting, may be avoided, and namely, the process are optimized. Furthermore, parasitics caused by small metal bonding pads are minimized, which may reduce power consumption and increase bandwidth.

Currently, in the VLSI technology, copper interconnect has become a mainstream. However, copper has a high diffusion rate in silicon and silica, therefore, copper is likely to diffuse into an active area including silicon and damage the device, thereby causing junction or silicon oxide leakage currents. A barrier layer may be employed to overcome copper diffusion and increase the adhesion between copper and silicon oxide, however, during the bonding process, a chemical bond may not be formed in the barrier layer on silicon oxide, resulting in a weak bonding strength. On the other hand, the adhesion between copper and silicon oxide is poor, so that depositing copper on a silicon wafer may be difficult and copper may not stick to the silicon wafer, resulting in poor mechanical and electrical connection between wafers. Furthermore, even in the air at a low temperatures (such as less than 200° C.), copper is also likely to be oxidized, and a protective layer will not be formed to prevent further oxidation. Besides, while bonding a metal with another metal, a gap may be formed around the bonding area, and the gap may be increased when the height of a metal pad is increased, which may reduce the bonding strength and increase post treatment after bonding.

SUMMARY

Embodiments of the present disclosure provide a low temperature wafer bonding method and a bonded structure. With the method, direct wafer bonding may be formed at a low temperature, and without adhesive and external pressure, so as to obtain stable and reliable mechanical and electrical connection.

In one aspect, there is provided a low temperature wafer bonding method, including:
  providing a first substrate comprising a plurality of metal pads and a first dielectric layer close to the metal pads, where the metal pads and the first dielectric layer are on a top surface of the first substrate;
  providing a second substrate comprising a plurality of semiconductor pads and a second dielectric layer close to the semiconductor pads, where the semiconductor pads and the second dielectric layer are on a top surface of the second substrate;
  disposing at least one of the metal pads in direct contact with at least one of the semiconductor pads, and disposing the first dielectric layer in direct contact with the second dielectric layer; and under pressure applied to the first substrate and the second substrate, bonding the metal pads with the semiconductor pads, and bonding the first dielectric layer with the second dielectric layer.

In one embodiment, the low temperature bonding is between wafers. In other embodiments, the low temperature bonding is between chips, or between a wafer and one or more chips.

In one embodiment, the metal pads have a surface lower than or protrude from a surface of the first dielectric layer. Preferably, the metal pads have a surface lower than a surface of the first dielectric layer. The semiconductor pads have a surface lower than or protrude from a surface of the second dielectric layer. Preferably, the semiconductor pads have a surface lower than a surface of the second dielectric layer.

In one embodiment, the metal pads have a top surface protruding from that of the first dielectric layer, and the semiconductor pads are formed in grooves in the second dielectric layer. Preferably, the semiconductor pads have a top surface lower than that of the second dielectric layer. In another embodiment, the semiconductor pads have a top surface protruding from that of the second dielectric layer, and the metal pads are formed in grooves in the first dielectric layer. Preferably, the metal pads have a top surface lower than that of the first dielectric layer.

It can be understood by those skilled in the art that the semiconductor pads and the metal pads may be both disposed on or protrude from top surfaces of the dielectric layers, or have a surface lower than that of the dielectric layers, or a combination thereof.

In one embodiment, the first and second substrates are kept in parallel and optically aligned with each other, the semiconductor pads are aligned with the metal pads, and the first and second dielectric layers are brought into direct contact in a vacuum environment.

In one embodiment, the step of bonding the metal pads with the semiconductor pads includes: under the pressure applied to the first substrate and the second substrate, heating the first substrate and the second substrate to 100° C.-450° C. so that the metal pads protrude due to thermal expansion, bonding the metal pads with the semiconductor pads, and bonding the first dielectric layer with the second dielectric layer. As for a chip or wafer including one or more PN junctions, this temperature will not lead to thermal diffusion or changes of electrical properties of the one or more PN junctions or a microelectronic device formed with the one or more PN junctions.

In one embodiment, the metal pads may have a size less than, or equal to, or greater than that of the semiconductor pads. Optionally, the metal pads may have a size less than that of the semiconductor pads, so that after the metal pads and the semiconductor pads are aligned, each of the metal pad's surface falls into that of a corresponding semiconductor pad, thereby effectively avoiding the electrical property change of devices caused by diffusion of metal.

In one embodiment, after being bonding with the semiconductor pads, each of the metal pad's surface falls into that of a corresponding semiconductor pad, and portions of the semiconductor pads which are beyond the metal pads are brought into direct contact and bonded with the first dielectric layer.

In one embodiment, material of the metal pads comprises aluminum, gold, nickel, or an alloy thereof, and material of the semiconductor pads comprises germanium, silicon, or an alloy thereof.

In one embodiment, bonding area of the first dielectric layer and the second dielectric layer is processed by chemical mechanical polishing to have a surface roughness less than about 3.0 nm, preferably, less than or equal to 1.0 nm.

In one embodiment, the metal pads and the semiconductor pads have a thickness less than about 2000 nm.

In another aspect, there is provided a bonded structure of wafers, including: a first substrate having a plurality of metal pads, a first dielectric layer close to the metal pads, a second substrate having a plurality of semiconductor pads, and a second dielectric layer close to the semiconductor pads, wherein the metal pads and the first dielectric layer are on a top surface of the first substrate, and the semiconductor pads and the second dielectric layer are on a top surface of the second substrate; the metal pads and the semiconductor pads are aligned, brought into contact and bonded with each other, respectively; and the first dielectric layer and the second dielectric layer are aligned, brought into contact and bonded with each other.

In another aspect, there is provided a bonded structure of a wafer and a chip, including: a first substrate having a plurality of metal pads, a first dielectric layer close to the metal pads, a second substrate having a plurality of semiconductor pads, and a second dielectric layer close to the semiconductor pads, wherein the metal pads and the first dielectric layer are on a top surface of the first substrate, and the semiconductor pads and the second dielectric layer are on a top surface of the second substrate; the metal pads and the semiconductor pads are aligned, brought into contact and bonded with each other, respectively; and the first dielectric layer and the second dielectric layer are aligned, brought into contact and bonded with each other.

In another aspect, there is provided a bonded structure of chips, including: a first substrate having a plurality of metal pads, a first dielectric layer close to the metal pads, a second substrate having a plurality of semiconductor pads, and a second dielectric layer close to the semiconductor pads, wherein the metal pads and the first dielectric layer are on a top surface of the first substrate, and the semiconductor pads and the second dielectric layer are on a top surface of the second substrate; the metal pads and the semiconductor pads are aligned, brought into contact and bonded with each other, respectively; and the first dielectric layer and the second dielectric layer are aligned, brought into contact and bonded with each other.

In one embodiment, the bonded structure of a wafer and a chip includes at least one chip.

In one embodiment, the chip or wafer includes at least one PN junction.

In one embodiment, the metal pads have a size less than that of the semiconductor pads, each of the metal pad's surface falls into that of a corresponding semiconductor pad, and portions of the semiconductor pads beyond the metal pads are brought into contact and bonded with the first dielectric layer. Preferably, the bonded structure comprises a seamless bonded interface.

Compared with the conventional art, the present disclosure has the following advantages:

With the method provided in embodiments of the present disclosure, direct wafer bonding may be formed at a low temperature, and without adhesive and external pressure.

Metal/semiconductor direct bonding is compatible with the VLSI technology, and may be performed at a low temperature, thereby reducing the influence of thermal expansion, because most metal has a much higher coefficient of thermal expansion than that of semiconductor. The method provided in embodiments of the present disclosure is compatible with the three-dimensional SOC manufacturing process, where the pads are bonded in the vertical direction or in a plug structure type, which simplifies the SOC manufacturing process greatly, and improves performances of SOC, such as speed, power consumption, etc.

Furthermore, the following work after the bonding process may be reduced. Mechanical injury caused by a thin chip may be eliminated, and the bonding strength between substrates may be close to the mechanical breaking strength of the substrate. Besides, step coverage problems caused in a deep plug etching may be avoided, and the method provided in the present disclosure may be used to form an electrode with a small size, thereby reducing parasitic between the bonded wafers.

Metal/semiconductor direct bonding provided in the present disclosure may form a pad smaller than that formed a flip chip, and may be used to bond devices with a metal substrate.

Metal/semiconductor direct bonding provided in the present disclosure is spontaneous and no external pressure is needed. Under normal environmental conditions, metal/semiconductor direct bonding and bonding of chips or wafers may be achieved. Besides, bonding of semiconductor/metal, oxide/oxide, semiconductor/oxide, and metal/oxide may be achieved. Metal/semiconductor direct bonding provided in the present disclosure is compatible with the standard VLSI process, which has a low production cost and may be industrialized.

DETAILED DESCRIPTION OF THE DISCLOSURE

Figure 1A:
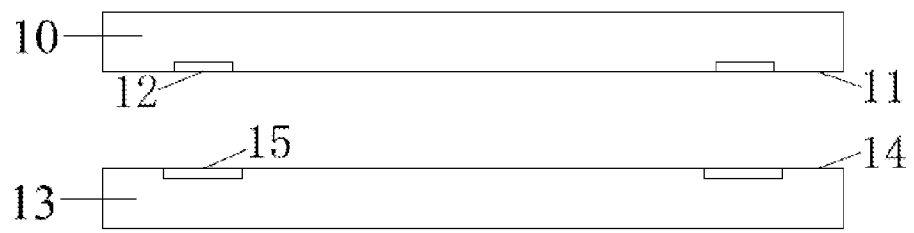
FIG. 1A to FIG. 1D are schematic cross-sectional views of a first embodiment of the present disclosure.

Hereunder, the present disclosure will be described in detail with reference to embodiments, in conjunction with the accompanying drawings.

A method for wafer bonding at a low temperature is provided in embodiments of the present disclosure. The method includes:

Providing a first substrate having a plurality of metal pads and a first dielectric layer close to the metal pads, where the metal pads and the first dielectric layer are on the top surface of the first substrate;

Providing a second substrate having a plurality of semiconductor pads and a second dielectric layer close to the semiconductor pads, where the semiconductor pads and the second dielectric layer are on the top surface of the second substrate;

Disposing at least one of the metal pads in direct contact with at least one of the semiconductor pads, and disposing the first dielectric layer in direct contact with the second dielectric layer; and Under pressure applied to the first substrate and the second substrate, bonding the metal pads and the semiconductor pads, and bonding the first dielectric layer with the second dielectric layer.

In one embodiment of the present disclosure, the bonding occurs between wafers.

In another embodiment of the present disclosure, the bonding occurs between a chip and a wafer, or between multiple chips and a wafer.

In another embodiment of the present disclosure, the bonding occurs between chips.

In embodiments of the present disclosure, at least one PN junction is formed in a wafer or chip. In more wide applications, transistors may be formed with the multiple PN junctions, circuits may be formed with the formed transistors, or a PN junction array devices may be formed with multiple PN junctions, such as photoelectric sensor array including a silicon based CMOS, system on chip constituted by the silicon based CMOS, and a wafer.

In one embodiment, the metal pads may be made of aluminum, gold, nickel, or an alloy thereof, and the semiconductor pads may be made of germanium, silicon, or an alloy thereof. The metal and semiconductor pads may have a thickness less than 2000 nm. Optionally, the metal pads have a size smaller than that of the semiconductor pads.

In one embodiment, chemical mechanical polishing (CMP) is performed on bonding areas of the first and second dielectric layers, so that the bonding areas have a surface roughness less than 3.0 nm. In another embodiment, the bonding areas are processed with fine chemical mechanical polishing to have a surface roughness less than 1.0 nm.

In one embodiment, the first and second substrates are kept parallel to each other and optically aligned, the plurality of metal pads are aligned with the plurality of semiconductor pads correspondingly, and the first dielectric layer is directly contacted with the second dielectric layer in a vacuum environment.

In one embodiment, the metal pads and the semiconductor pads are boned under the pressure applied to the first substrate and the second substrate, where the first substrate and the second substrate are heated to 100° C.-450° C. so that the metal pads protrude due to thermal expansion. The first dielectric layer and the second dielectric layer are also bonded.

The metal pads may have a size less than, or equal to, or greater than that of the semiconductor pads. Optionally, the metal pads may have a size less than that of the semiconductor pads, so that after the metal pads and the semiconductor pads are aligned and boned, the metal pads may be covered by the semiconductor pads, thereby effectively avoiding the electrical property change of devices caused by diffusion of metal.

After being bonded with the semiconductor pads, the metal pads are completely covered by the semiconductor pads, and portions of the semiconductor pads which are beyond the metal pads are brought into direct contact and bonded with the first dielectric layer.

In one embodiment, the metal pads are dented in the first dielectric layer, and the semiconductor pads are dented in the second dielectric layer.

In another embodiment, the metal pads protrude from the first dielectric layer, while the semiconductor pads are configured in grooves of the second dielectric layer and have a top surface lower than the surface of the second dielectric layer.

A bonded structure between wafers is provided in embodiments of the present disclosure. The bonded structure includes: a first substrate having a plurality of metal pads and a first dielectric layer close to the metal pads, where the metal pads and the first dielectric layer are on a top surface of the first substrate; a second substrate having a plurality of semiconductor pads and a second dielectric layer close to the semiconductor pads, where the semiconductor pads and the second dielectric layer are on a top surface of the second substrate. The metal pads are aligned and bonded with the semiconductor pads, and the first dielectric layer are aligned and bonded with the second dielectric layer.

In one embodiment, a bonded structure between chips is provided.

In another embodiment, a bonded structure between one or more chips and a wafer is provided.

In one embodiment, at least one PN junction is formed in a wafer or chip. The metal pads may have a size less than that of the semiconductor pads and be completely covered by the semiconductor pads, and portions of the semiconductor pads which are beyond the metal pads directly contact and bond the first dielectric layer. The bonded structure provided in embodiments of present disclosure has a seamless bonding interface.

Hereinafter, the embodiments of the present disclosure will be described in detail.

In the following, the term "on" or "below" means that the substrate is used as a base, or the direction from the substrate to the oxide layer, the dielectric layer or the pad is from bottom to top, in other words, no matter how the wafer or chip is placed, devices formed on the chip or wafer are arranged on or on the top surface of the substrate.

FIG. 1A to FIG. 1D are schematic cross-sectional views of a first embodiment of the present disclosure. Referring to FIG. 1A, a first wafer 10 and a second wafer 13 have a first surface 11 and a second surface 14 opposite to the first surface. In one embodiment, the first and second wafers are made of silicon oxide. The first surface 11 and the second surface 14 are polished by chemical mechanical polishing (CMP) to have a roughness of about 0.5 nm. Multiple metallic aluminum pads 12 which have a diameter of about 5 mm, a height of about 30 nm and an interval of about 10 mm are deposited on the first surface 11 by chemical vapor deposition (CVD). In other embodiments, the metal pads may be formed by sputtering, evaporation or electroplating. Multiple semiconductor germanium pads 15 which have a diameter of about 7 mm, a height of about 30 nm and an interval of about 10 mm are deposited on the second surface 14. In other embodiments, the metal pads may be metallic gold pads, metallic nickel pads, or an alloy thereof; the semiconductor pads may be silicon pads or germanium-silicon pads. In order to ensure that surfaces of the metal pads and semiconductor pads are not polluted by oxide or pollutant, surfaces of the metal pads and semiconductor pads may be cleaned by sputtering and a metal film may be formed thereon by physical vapor deposition (PVD) or evaporation before bonding. For example, a metal film which has a thickness of about 5 nm and is made of gold, platinum or palladium may be formed on the metal pads 12 and the semiconductor pads 15, and hydrocarbon pollutant on the surfaces of the metal pads 12 and the semiconductor pads 15 may be eliminated with ultraviolet lamp in ozone with high concentration. In other embodiments, nitrogen plasma or inert gas plasma may be used to clean the surfaces of the metal pads 12 and the semiconductor pads 15, which can also enhance bonding energy at room temperature. Hydrocarbon residual on the surfaces of the metal pads may reduce metal bonding and may become nucleation sites of bubbles formed at bonding interface, which may result in degassing of the bonding interface. The first surface 11 of the first wafer 10 includes metallic aluminum pads 12 and bonding areas which are made of silicon oxide and close to the metallic aluminum pads 12, and the second surface 14 of the second wafer 12 includes the germanium pads 15 and bonding areas which are made of silicon oxide and close to the germanium pads 15. The top surfaces of the metallic aluminum pads 12 flush with that of the first surface 11, and the top surfaces of the germanium pads 15 flush with that of the second surface 14. In other embodiments, the aluminum pads 12 and the germanium pads 15 may be higher or lower than surfaces of the wafers. The first wafer 10 and the second wafer 13 are kept in parallel to each other, and then optically aligned, so the aluminum pads 12 and the germanium pads 15, which are configured on the first surface 11 and the second surface 14 opposite to the first surface 11, respectively, are aligned and arranged opposite to each other in the vertical direction. The aluminum pads 12 and the germanium pads 15 are adapted for connecting devices and circuits on the wafers.

Figure 1B:
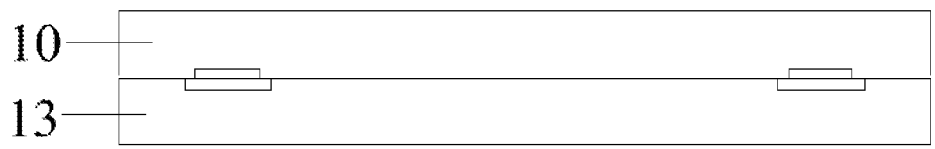

FIG. 1B schematically illustrates the aluminum pads 12 and the germanium pads 15 coming exactly into contact in a vacuum environment. At this point, the aluminum pads 12 still can be separated from the germanium pads 15.

Figure 1C:
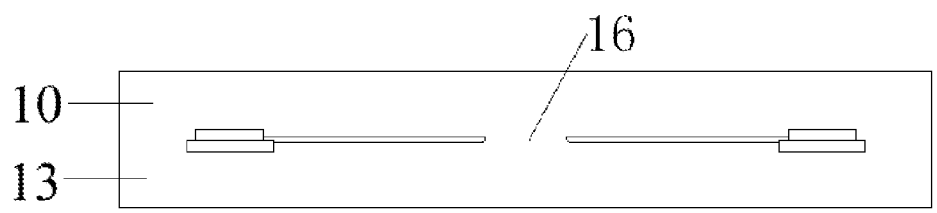

Referring to FIG. 1C, the pressure generated when the aluminum pads 12 is bonded with the germanium pads 15 induces elastic deformation to the aluminum pads 12 and the germanium pads 15, so that bonding areas on the first wafer 10 and the second wafer 13 may contact at a bonding junction area 16, and portions of the germanium pads 15 surrounding the aluminum pads 12 directly contact the silicon oxide dielectric layer on the first surface 11. It should be noted that only an initial contact area of silicon oxide on the two wafers are schematically shown in FIG. 1C, and there may be one or more other initial contact areas on the two wafers.

Figure 1D:

FIG. 1D schematically illustrates a cross-sectional view of substrates of a bonded wafer. With the bonding process going on, the bonding junction area 16 gradually extends to the whole surfaces of the wafers and forms a new bonding junction area 17. The bonding strength is weak at the beginning of the bonding and will be strengthened gradually with extension of the bonding junction area. As shown in FIG. 1D, without an external pressure, the aluminum pads 12 may be brought into contact with the germanium pads 15 by the pressure generated by chemical bond formed in the wafer bonding. A strong chemical bond may be formed between the two opposite surfaces of the bonded wafer, and portions of the dielectric layer around the aluminum pads 12 contact and bond with the germanium pads 15. In an embodiment, in order to decrease the time period for forming the chemical bond, a low temperature annealing process is performed after the bonding process at the room temperature. The time period for annealing may be decreased with increase of the annealing temperature. For example, if the annealing temperature is about 100° C., the time period for annealing will be about five hours; if the annealing temperature is about 150° C., the time period for annealing will be about one hours; if the annealing temperature is about 250° C., the time period for annealing will be about 20 minutes; and if the annealing temperature is about 450° C., the time period for annealing will be about 1 minute. The thinner the metal pads and the semiconductor pads, the lower the temperature of the bonding process. The thicker the metal pads and the semiconductor pads, the longer the time period of the bonding process. After the temperature annealing process, the metal pads may protrude its original surface due to thermal expansion, and the portions of the germanium pads 15 round the aluminum pads 12 will come into contact with the silicon oxide dielectric layer on the first surface 11.

Referring to FIG. 1D, the germanium pads 15 and the aluminum pads 12 are brought into contact and bonded, and a strong chemical bond is formed. Portions of the dielectric layers around the germanium pads 15 and the aluminum pads 12 are also brought into contact and bonded, and a strong chemical bond is formed. A seamless bonding is created at the interface of the wafers, which increases the bonding strength greatly. At least one PN junction (not shown in the drawings) is provided in the wafers 10 and 13. In one embodiment, a circuit consisting of multiple transistors which includes multiple PN junctions is provided. The germanium pads 15 have a size greater than that of the aluminum pads 12, therefore, after the first wafer 10 is bonded with the second wafer 13, the germanium pads 15 cover the aluminum pads 12 completely, and portions of the germanium pads 15 beyond the aluminum pads 12 are brought into contact and bonded with the first dielectric layer, which forms a seamless bonding.

Figure 2A:
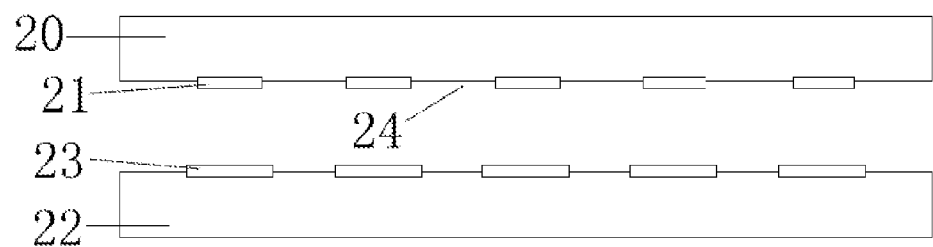
FIG. 2A-2C schematically illustrates a modification of the first embodiment.
Figure 2B:
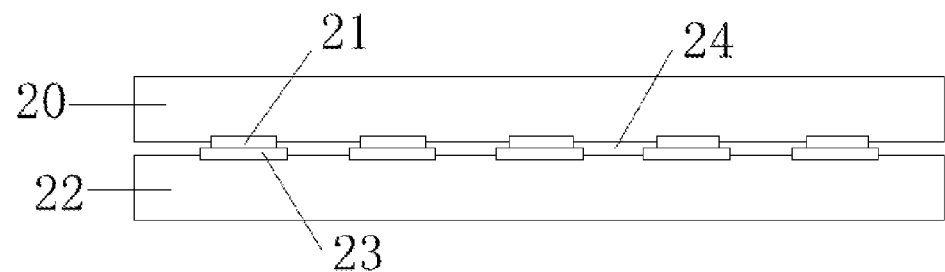
Figure 2C:
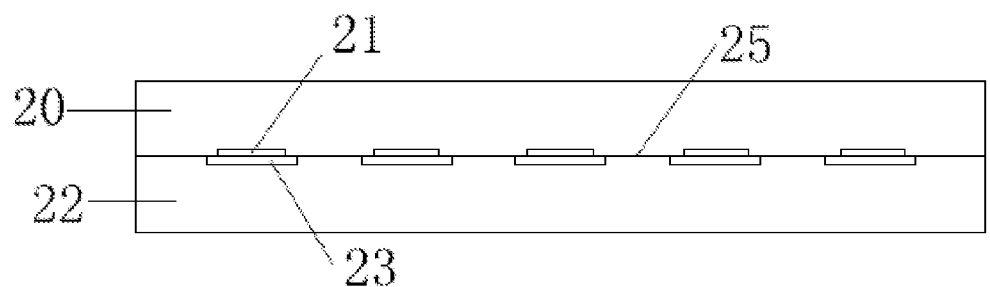

FIG. 2A-2C schematically illustrate a modification of the first embodiment. FIG. 2A is a schematic cross-sectional view of two opposite wafers before bonding. Difference between this embodiment and the first embodiment is that multiple metallic aluminum pads 21 and multiple semiconductor germanium pads 23 are configured on and protrude from surfaces of a first wafer 20 and a second wafer 22, respectively, where the multiple metallic aluminum pads 21 and the multiple semiconductor germanium pads 23 protrude from the surfaces of the first wafer 20 and the second wafer 22 by a height of 5 nm to 50 nm. In FIG. 2A, five pairs of metal/semiconductor pads are shown. It should be noted that the number of the pads may not be limited thereto and may be determined according to practical requirements. The multiple metallic aluminum pads 21 and the multiple semiconductor germanium pads 23 are optically aligned and arranged opposite to each other in vertical direction, and the semiconductor germanium pads 23 have a size greater than that of the metallic aluminum pads 21. Intervals 24 are configured between two adjacent pads. In FIG. 2B, the aluminum pads 21 and the germanium pads 23 comes exactly into contact. In FIG. 2C, the dielectric layers of the two wafers are bonded at the intervals 24 and a chemical bond 25 is formed at the bonding interface. After an annealing process at a temperature of 100° C. to 450° C. is performed, the metallic aluminum pads 21 will protrude due to thermal expansion, and portions of the semiconductor germanium pads 23 beyond the metallic aluminum pads 21 is bonded with the silicon oxide dielectric layer on the first wafer 20.

Referring to FIG. 2C, the semiconductor germanium pads 23 and the metallic aluminum pads 21 are in contact and bonded with each other, and a strong chemical bond is formed. Portions of the dielectric layers close to the semiconductor germanium pads 23 and the metallic aluminum pads 21 are in contact and bonded with each other, and a strong chemical bond is formed. Therefore, a seamless bonding is formed at the interface of the wafers, which increases the bonding strength greatly. The first wafer 20 and the second wafer 22 include a circuit consisting of multiple PN junctions (not shown in the drawings). The germanium pads 23 have a size greater than that of the aluminum pads 21, therefore, after the first wafer 20 is bonded with the second wafer 22, the germanium pads 23 cover the aluminum pads 21 completely, and portions of the germanium pads 23 beyond the aluminum pads 21 are brought into contact and bonded with the first dielectric layer, which forms a seamless bonding.

Figure 3A:
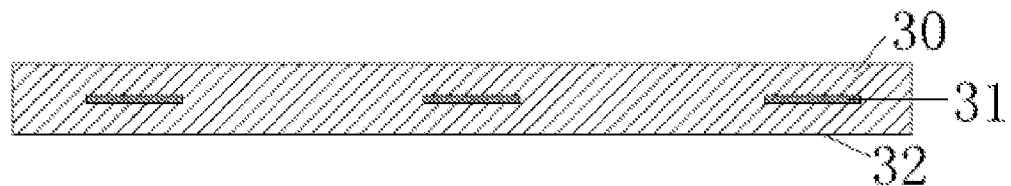
FIG. 3A to FIG. 3D are schematic cross-sectional views of a second embodiment of the present disclosure.

FIG. 3A to FIG. 3D are schematic cross-sectional views of a second embodiment of the present disclosure, in which two different chips are bonded. Referring to FIG. 3A, a metal interconnection 31 is configured in a silicon oxide layer of a first chip 30. The first chip 30 includes a semiconductor device and a circuit which include multiple PN junctions. A surface 32 of the first chip 30 is processed by CMP, which is similar to the first embodiment and will not be described in detail here.

Figure 3B:
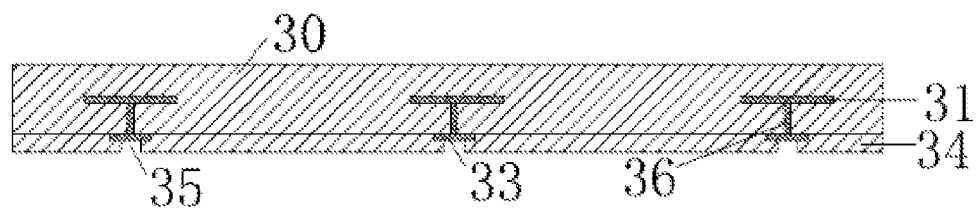

Referring to FIG. 3B, a via 36 is formed in the silicon oxide layer and the via 36 is filled with metal which is connected to the metal interconnection 31. A semiconductor germanium pad 33 which is connected to the via 36 is formed on the surface 32. A silicon oxide layer 34 which has a thickness greater than that of the semiconductor germanium pad 33 is formed on the first chip 30, and then an opening 35 which has a width less than that of the semiconductor germanium pad 33 is formed in the silicon oxide layer 34 at a position corresponding to the semiconductor germanium pad 33. The silicon oxide layer 34 is processed by CMP to have a roughness of about 0.8 nm.

Figure 3C:
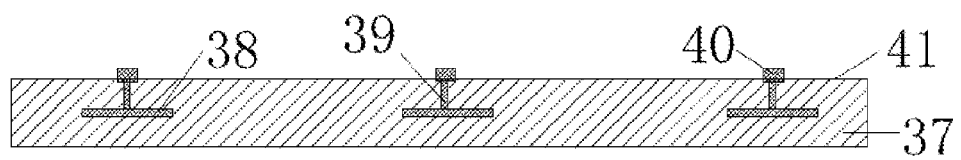
Figure 3D:
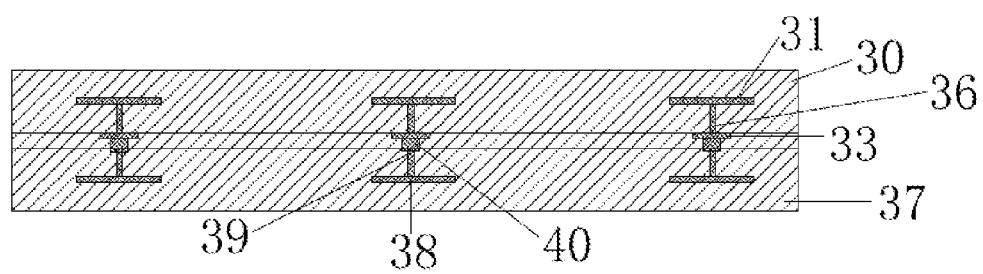

Referring to FIG. 3C, a metal interconnection 38 is formed in a second chip 37, a via 39 is formed on the metal interconnection 38, and the via 39 is filled with metal which is connected to the metal interconnection 38. A surface 41 of the second chip 37 is polished with CMP to have a roughness of about 0.6 nm. A metal pad 40 which is connected to the via 39 is formed on the via 39. The metal pad 40 has a width equal to or less than that of the opening 35. Referring to FIG. 3D, during a bonding process, the first and second chips are kept in parallel and optically aligned, and then the metal pad 40 is aligned with the opening 35 in the silicon oxide layer 34 on the first chip 30, whereby the first chip 30 and the second chip 37 are brought into contact and bonded.

Similar to the first embodiment, the silicon oxide layer including the semiconductor germanium pad 33 and the silicon oxide layer including the metal pad 40 on the surface 41 are brought into contact and bonded with each other. And with the extension the bonding area, the bonding strength increases gradually. In the embodiment, the two chips are bonded without an external pressure, and after an annealing process is performed, a seamless bonding is formed at the bonding interface of the two chips, thus, the following work after the bonding process may be reduced, and the bonding adhesion and strength may be improved, which creates stable and reliable mechanical and electrical connection.

Referring to FIG. 3D, the germanium pad 33 and the metal pad 40 are brought into contact and bonded, and a strong chemical bond is formed. Portions of the dielectric layers around the germanium pad 33 and the metal pad 40 are also brought into contact and bonded, and a strong chemical bond is formed. The germanium pad 33 have a size greater than that of the metal pad 40, therefore, after the first wafer 30 is bonded with the second wafer 37, the germanium pad 33 covers the metal pad 40 completely, and portions of the germanium pad 33 beyond the metal pad 40 are brought into contact and bonded with the first dielectric layer, which forms a seamless bonding and increases the bonding strength greatly.

Figure 4A:
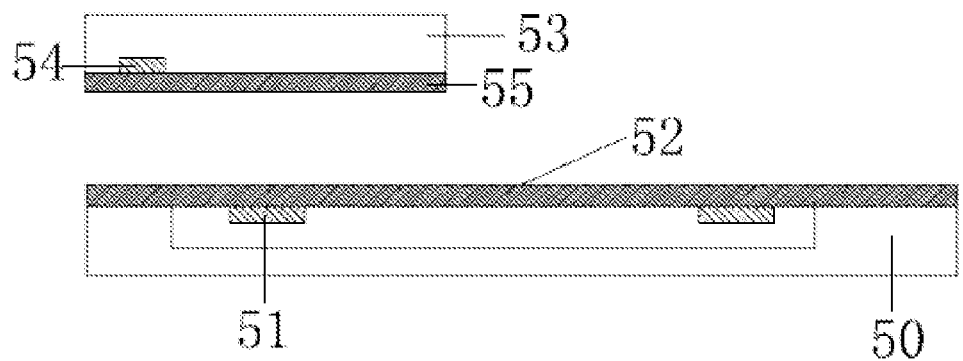
FIG. 4A to FIG. 4D are schematic cross-sectional views of a third embodiment of the present disclosure.
Figure 4B:
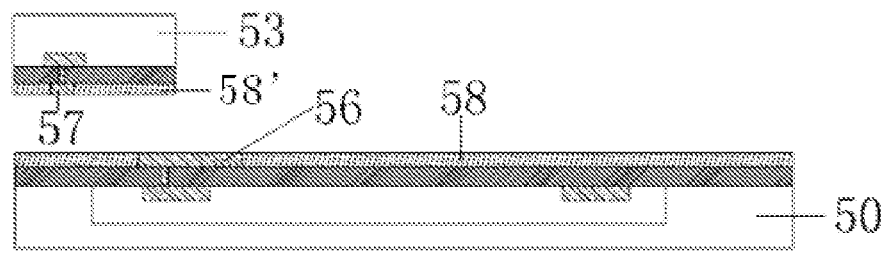
Figure 4C:
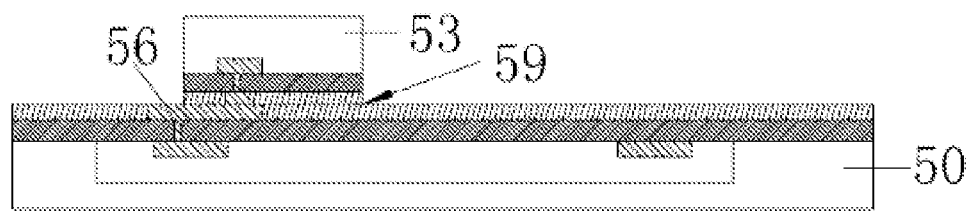

FIG. 4A to FIG. 4C are schematic cross-sectional views of a third embodiment of the present disclosure. Referring to FIG. 4A, a metal interconnection 51 is formed on a wafer 50 and in a silicon oxide layer 52, where the silicon oxide layer 52 is formed by plasma enhanced chemical vapor deposition (PECVD). In other embodiments, the silicon oxide layer 52 may be formed by thermal oxidation or spin coating. As shown in FIG. 4A, a chip 53 having a metal interconnection 54 and a silicon oxide layer 55 is provided. Referring to FIG. 4B, vias are respectively formed in silicon oxide layer 52 on the wafer 50 and in the silicon oxide layer 55 on the chip 53 by etching, where the vias are respectively vertical to and formed at a position corresponding to the metal interconnection 51 and the metal interconnection 54. Then, the vias are filled with metal, a silicon oxide layer 58 and a silicon oxide layer 58' are respectively formed on the wafer 50 and the chip 53, and openings are respectively formed in the silicon oxide layer 58 and the silicon oxide layer 58', where the openings are respectively formed at a position corresponding to the metal interconnection 51 and the metal interconnection 54. Thereafter, the opening in the silicon oxide layer 58 on the wafer 50 is filled with germanium to form a germanium pad 56, and the opening in the silicon oxide layer 58' on the chip 53 is filled with aluminum to form an aluminum pad 57. Then the silicon oxide layer 58 and the silicon oxide layer 58' are processed by CMP and surface treatment, which are similar to the first embodiment and will not be described in detail here. Referring to FIG. 4C, the germanium pad 56 on the wafer 50 and the aluminum pad 57 on the chip 53 are brought into contact and bonded, and the silicon oxide layer 58 on the wafer 50 and the silicon oxide layer 58' on the chip 53 are bonded to form a chemical bond 59. After a low temperature annealing process, a seamless bonding may be formed between the wafer 50 and the chip 53, which increases the bonding strength greatly and forms a stable and reliable mechanical and electrical connection.

Figure 4D:
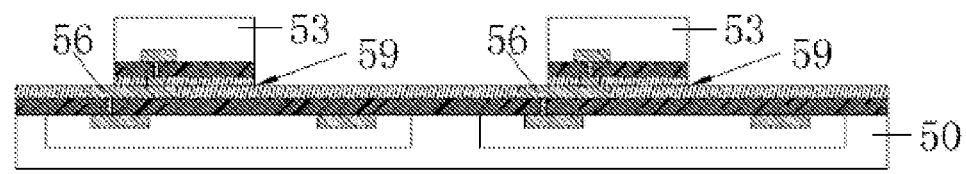

Referring to FIG. 4D, two chips 53 are both bonded with the wafer 50. It should be noted that one, two, or more chips may be boned with the wafer 50, and the number of the chips may be determined according to practical requirements. The chip and wafer may include a transistor circuit or a PN array device having multiple PN junctions. The germanium pad 56 and the aluminum pad 57 are brought into contact and bonded, and a strong chemical bond is formed. The portions of the dielectric layers close to the germanium pad 56 and the aluminum pad 57 are also brought into contact and bonded, and a strong chemical bond is formed. The germanium pad 56 have a size greater than that of the aluminum pad 57, therefore, after the wafer 50 is bonded with the chip 53, the germanium pad 56 covers the aluminum pad 57 completely, and a portion of the germanium pad 56 beyond the aluminum pad 57 are brought into contact and bonded with the dielectric layer, which forms a seamless bonding and increases the bonding strength greatly.

Figure 5A:
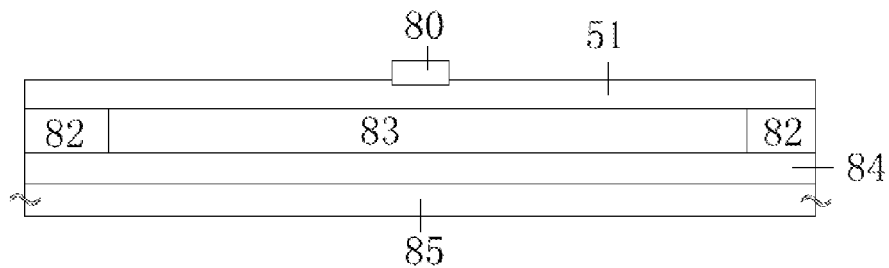
FIG. 5A to FIG. 5C are schematic cross-sectional views of a fourth embodiment of the present disclosure.
Figure 5B:
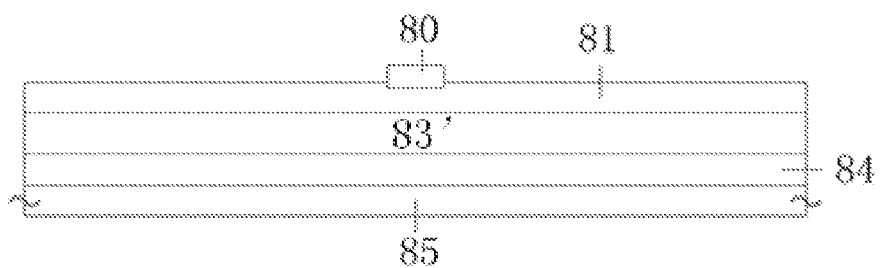
Figure 5C:
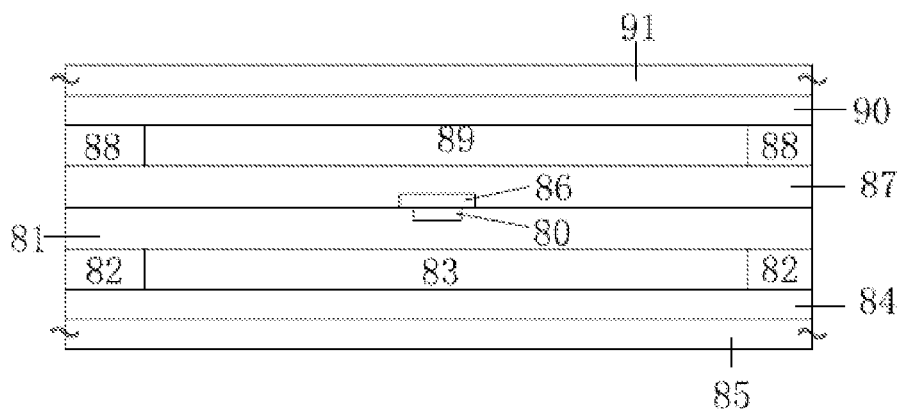

FIG. 5A to FIG. 5C are schematic cross-sectional views of a fourth embodiment of the present disclosure. In order to obtain more stable and reliable mechanical and electrical connection, height of the metal pad and the semiconductor pad may be increased, or height of non-metal areas around the pads may be decreased. In the embodiment, the height of the metal pad and the semiconductor pad is about 2000 nm. In other embodiments, the height of the metal pad and the semiconductor pad may be about 200 nm, 500 nm, 1000 nm or 1500 nm, which should not be limited thereto. Referring to FIG. 5A and FIG. 5B, a wafer having a substrate 85 is provided, where the substrate 85 may have a multi-layer structure. A layer 84 is formed on the substrate 85, and a layer 82 and a region 83 are formed on the layer 84. The region 83 may be made of low K dielectric material and formed by photo-etching, etching or deposition, which is well known to those skilled in the art. The region 83 occupies a major area of the layer 84. The layer 83 may also be made of low K dielectric material and forms a low K dielectric layer 83' together with the region 83. Then a dielectric layer 81, which is adapted for bonding, is formed on the region 82 and the layer 82, and a metallic nickel pad 80 is formed on the dielectric layer 81. Referring to FIG. C, the upper wafer includes a substrate 91 having a multi-layer structure, a layer 90, a layer 88 having a low K dielectric region 89 formed therein, and dielectric layer 87 formed on the dielectric region 89. The upper wafer has a similar structure with the lower wafer, and the difference is that a semiconductor germanium pad 86 is formed on the dielectric layer 87. FIG. 5C schematically illustrates a cross-sectional view of two wafers being bonded together. The metallic nickel pad 80 and the semiconductor germanium pad 86 are brought into contact and bonded, and portions of the dielectric layers around the metallic nickel pad 80 and the semiconductor germanium pad 86 are also brought into contact and bonded, which forms a strong chemical bond. After an annealing process is performed, a seamless bonding is formed at the bonding interface of the two wafers, thus, the following work after the bonding process may be reduced, and the bonding adhesion and strength may be improved, which creates stable and reliable mechanical and electrical connection.

Referring to FIG. 5C, the germanium pad 86 and the nickel pad 80 are brought into contact and bonded, and a strong chemical bond is formed. Portions of the dielectric layers around the germanium pad 86 and the nickel pad 80 are also brought into contact and bonded, and a strong chemical bond is formed. The germanium pad 86 have a size greater than that of the nickel pad 80, therefore, after the two wafers are bonded, the germanium pad 86 covers the nickel pad 80 completely, and portions of the germanium pad 86 beyond the nickel pad 80 are brought into contact and bonded with the first dielectric layer, which forms a seamless bonding and increases the bonding strength greatly.

Figure 6A:
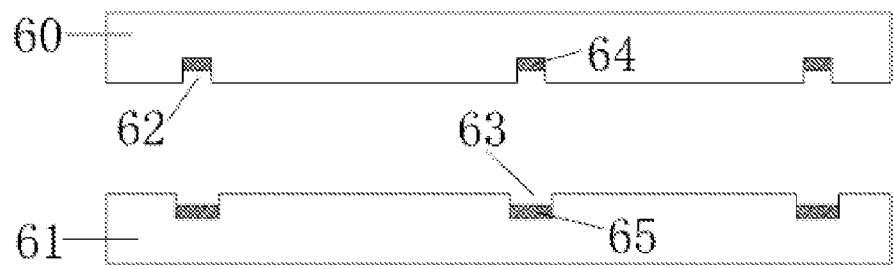
FIG. 6A to FIG. 6C are schematic cross-sectional views of a fifth embodiment of the present disclosure.
Figure 6B:
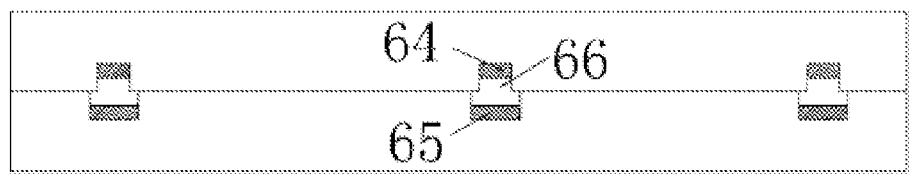
Figure 6C:
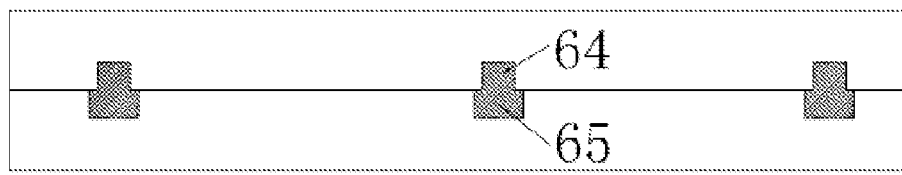

FIG. 6A to FIG. 6C are schematic cross-sectional views of a fifth embodiment of the present disclosure. Referring to FIG. 6A, a first wafer 60 and a second wafer 61 are processed by CMP to obtain an overall planarized surface which has a roughness of about 0.3 nm. Grooves 62 and 63 are respectively formed on the polished surfaces of the wafers 60 and 61. A metal gold pad 64 is formed in the groove 62 and a semiconductor germanium pad 65 is formed in the groove 63. Referring to FIG. 6B, the polished surfaces of the wafers 60 and 61 are brought into contact and a chemical bond is formed on the planarized interface. There is no gap on the bonding interface of the wafers 60 and 61. Because the metal gold pad 64 and the semiconductor germanium pad 65 are formed in the grooves, reliable electrical connection is not created yet.

Referring to FIG. 6C, after the chemical bond is formed on the bonding interface of the wafers, the bonded wafers are rotated and processed by melt flow and annealing at a low temperature, so that the metal gold pad 64 and the semiconductor germanium pad 65 are melted and mutually flow into contact with each other under the action of gravity and capillary force, and eutectic silicon bonding may be created, thereby forming a stable and reliable mechanical and electrical connection between gold and germanium.

Referring to FIG. 6C, the metal gold pad 64 and the semiconductor germanium pad 65 are brought into contact and bonded, and a strong chemical bond is formed. Portions of the dielectric layers around the metal gold pad 64 and the semiconductor germanium pad 65 are also brought into contact and bonded, and a strong chemical bond is formed. The semiconductor germanium pad 65 have a size greater than that of the metal gold pad 64, therefore, after the two wafers are bonded, the semiconductor germanium pad 65 covers the metal gold pad 64 completely, and portions of the semiconductor germanium pad 65 beyond the metal gold pad 64 are brought into contact and bonded with the dielectric layer, which forms a seamless bonding and increases the bonding strength greatly.

Figure 7A:
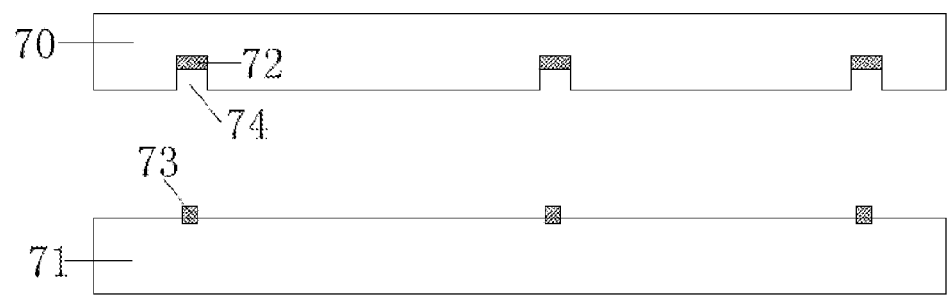
FIG. 7A to FIG. 7C are schematic cross-sectional views of a sixth embodiment of the present disclosure.
Figure 7B:
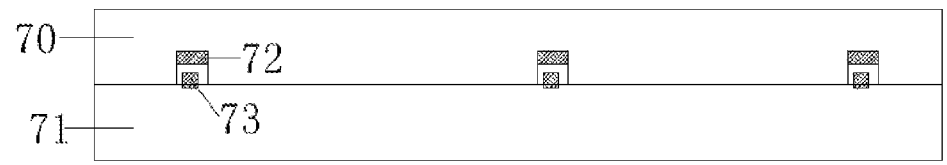
Figure 7C:
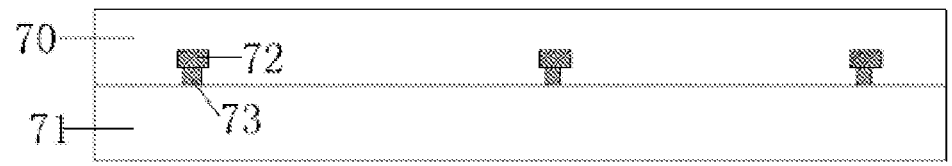

FIG. 7A to FIG. 7C are schematic cross-sectional views of a sixth embodiment of the present disclosure. The sixth embodiment is similar to the fifth embodiment, and the difference is that, a first wafer 71 has a metal gold pad 73 which protrudes from a surface of the wafer 71, a second wafer 70 has a groove 74 which has a depth greater than a height of the metal gold pad 73, and a semiconductor silicon pad 72 is formed in the groove 74, as shown in FIG. 7A. The metal gold pad 73 and the groove 74 are arranged opposite to each other in the vertical direction. Referring to FIG. 7B, the first wafer 71 and the second wafer 70 are brought into contact and bonded to form a chemical bond, while the metal gold pad 73 and the semiconductor silicon pad 72 are not in contact yet, and no reliable mechanical or electrical connection is formed yet. Referring to FIG. 7C, after being processed by melt flow and annealing at a low temperature, the metal gold pad 73 and the semiconductor silicon pad 72 are brought into contact with each other and bonded, and eutectic silicon bonding may be created, thereby forming a stable and reliable mechanical and electrical connection between gold and silicon.

Referring to FIG. 7C, the metal gold pad 73 and the semiconductor silicon pad 72 are brought into contact and bonded, and a strong chemical bond is formed. Portions of the dielectric layers around the metal gold pad 73 and the semiconductor silicon pad 72 are also brought into contact and bonded, and a strong chemical bond is formed. The semiconductor silicon pad 72 have a size greater than that of the metal gold pad 73, therefore, after the two wafers are bonded, the semiconductor silicon pad 72 covers the metal gold pad 73 completely, and portions of the semiconductor silicon pad 72 beyond the metal gold pad 73 are brought into contact and bonded with the dielectric layer, which forms a seamless bonding and increases the bonding strength greatly.

In light of the above, embodiments provided in the present disclosure may form bonding in whole top surfaces of wafers, that is, bonding in wafer level may be obtained. However, the scope of the present disclosure should not be limited thereto, in other embodiments, multilayer wafer bonding may be obtained to form a high-density vertical interconnect structure, let alone the bonding between a wafer and a chip, or between chips. At a low temperature, a bonding may be obtained between metal and metal, or between semiconductor and semiconductor, or between semiconductor and oxide, or between metal and oxide which are formed on the wafers, where the metal may be aluminum, nickel, or an alloy thereof, or other metal which has a light diffusion effect in silicon or silicon oxide, thereby avoiding the problems caused by copper diffusing in silicon or silicon oxide in the conventional art.

Although the present disclosure has been disclosed above with reference to preferred embodiments thereof, it should be understood that the disclosure is presented by way of example only, and not intended to be limiting. Those skilled in the art can modify and vary the embodiments without departing from the spirit and scope of the present disclosure.

The invention claimed is:

1. A low temperature wafer bonding method, comprising:
providing a first substrate comprising a plurality of metal pads and a first dielectric layer close to the metal pads, where the metal pads and the first dielectric layer are on a top surface of the first substrate;
providing a second substrate having a plurality of semiconductor pads and a second dielectric layer close to the semiconductor pads, where the semiconductor pads and the second dielectric layer are on a top surface of the second substrate;
disposing at least one of the metal pads in direct contact with at least one of the semiconductor pads, and disposing the first dielectric layer in direct contact with the second dielectric layer; and
under pressure applied to the first substrate and the second substrate, bonding the metal pads with the semiconductor pads, and bonding the first dielectric layer with the second dielectric layer.

2. The method according to claim 1, wherein the step of disposing at least one of the metal pads in direct contact with at least one of the semiconductor pads, and disposing the first dielectric layer in direct contact with the second dielectric layer comprises:
keeping the first substrate in parallel with the second substrate, and aligning the first substrate with the second substrate optically, and matching up in position the plurality of metal pads with the plurality of semiconductor pads; and
disposing the first dielectric layer in direct contact with the second dielectric layer under vacuum.

3. The method according to claim 1, wherein the step of bonding the metal pads with the semiconductor pads comprises:
under the pressure applied to the first substrate and the second substrate, heating the first substrate and the second substrate to 100° C.-450° C. so that the metal pads protrude its original surface due to thermal expansion, bonding the metal pads with the semiconductor pads, and bonding the first dielectric layer with the second dielectric layer.

4. The method according to claim 1, wherein the metal pads have a size less than that of the semiconductor pads, and when the metal pads and the semiconductor pads are in contact, each of the metal pad's surface falls into that of a corresponding semiconductor pad, and portions of the semiconductor pads beyond the metal pads are in contact and bonded with the first dielectric layer.

5. The method according to claim 1, wherein material of the metal pads comprises aluminum, gold, nickel, or an alloy thereof.

6. The method according to claim 1, wherein material of the semiconductor pads comprises germanium, silicon, or an alloy thereof.

7. The method according to claim 1, further comprising chemical mechanical polishing bonding area of the first dielectric layer and the second dielectric layer to produce a surface having roughness less than about 3.0 nm.

8. The method according to claim 1, wherein the metal pads and the semiconductor pads have a thickness less than about 2000 nm.

9. The method according to claim 1, wherein the metal pads have a top surface flush with or lower than that of the first dielectric layer, and the semiconductor pads have a top surface flush with or lower than that of the second dielectric layer.

10. The method according to claim 1, wherein the metal pads have a top surface protruding from that of the first dielectric layer, and the semiconductor pads are formed in grooves in the second dielectric layer and have a top surface lower than that of the second dielectric layer; or the semiconductor pads have a top surface protruding from that of the second dielectric layer, and the metal pads are formed in grooves in the first dielectric layer and have a top surface lower than that of the first dielectric layer.

11. A bonded structure of wafers formed with the method in claim 1, comprising: a first substrate comprising a plurality of metal pads, a first dielectric layer close to the metal pads, a second substrate comprising a plurality of semiconductor pads, and a second dielectric layer close to the semiconductor pads, wherein the metal pads and the first dielectric layer are on a top surface of the first substrate, and the semiconductor pads and the second dielectric layer are on a top surface of the second substrate; the metal pads and the semiconductor pads are aligned correspondingly, disposed in contact and bonded with each other; and the first dielectric layer and the second dielectric layer are aligned correspondingly, disposed in contact and bonded with each other.

12. The bonded structure according to claim 11, wherein the bonded structure comprises a seamless bonded interface.

13. The bonded structure according to claim 11, wherein the metal pads have a size less than that of the semiconductor pads and each of the metal pad's surface falls into that of a corresponding semiconductor pad, and portions of the semiconductor pads beyond the metal pads are brought into contact and bonded with the first dielectric layer.

14. The bonded structure according to claim 11, wherein the wafer comprises at least one PN junction.

* * * * *